(12) United States Patent
Opris

(10) Patent No.: US 8,928,409 B1
(45) Date of Patent: Jan. 6, 2015

(54) TRANS-CAPACITANCE AMPLIFIER WITH PICOAMPERES INPUT BIASING AND LARGE OUTPUT SWING

(71) Applicant: Ion E. Opris, San Jose, CA (US)

(72) Inventor: Ion E. Opris, San Jose, CA (US)

( * ) Notice: Subject to any disclaimer, the term of this patent is extended or adjusted under 35 U.S.C. 154(b) by 54 days.

(21) Appl. No.: 13/940,261

(22) Filed: Jul. 12, 2013

(51) Int. Cl.
*H03F 3/45* (2006.01)

(52) U.S. Cl.
CPC .. *H03F 3/45071* (2013.01); *H03F 2003/45008* (2013.01); *H03F 2200/153* (2013.01); *H03F 2203/45114* (2013.01); *H03F 2203/45294* (2013.01)
USPC ............................................. 330/259; 330/85

(58) Field of Classification Search
USPC ............................. 330/259, 257, 260, 261, 85
See application file for complete search history.

(56) References Cited

U.S. PATENT DOCUMENTS

| | | | | |
|---|---|---|---|---|
| 5,252,928 A | * | 10/1993 | Giorgetta | 330/51 |
| 5,394,113 A | * | 2/1995 | Belcher | 330/260 |
| 5,952,885 A | * | 9/1999 | Wu et al. | 330/294 |
| 6,323,730 B1 | * | 11/2001 | Hynd | 330/85 |
| 8,390,374 B2 | * | 3/2013 | Alexander et al. | 330/69 |

* cited by examiner

*Primary Examiner* — Henry Choe

(57) ABSTRACT

According to some embodiments, a trans-capacitance amplifier is exhibiting an input current of the biasing in the range of picoAmperes while allowing large output swings. The trans-capacitance amplifier comprises an operational amplifier, a feedback capacitor, circuitry to DC bias and to AC ground the non-inverting input of the operational amplifier, and circuitry to DC bias the inverting input of the operational amplifier. According to some embodiments, the circuitry to bias the inverting input comprises a cascade of degenerated differential pairs. The first transistor of the first pair and the second transistor of the last pair have an active load. The cascade of differential pairs and the active load create a trans-conductance amplifier with a very low equivalent trans-conductance. According to some embodiments, the same invention applies to a differential trans-capacitance amplifier.

10 Claims, 6 Drawing Sheets

TRANS-CAPACITANCE AMPLIFIER WITH PICOAMPERES INPUT BIASING AND LARGE OUTPUT SWING

BACKGROUND

This invention relates to a trans-capacitance amplifier used in electronic systems in which the bias of the input is realized by a circuit with an input current in the range of picoAmperes.

Electronic systems which process the voltage provided by a sensing device approximately modeled by a capacitor (such as a MEMS gyroscope or a MEMS microphone) use a continuous time, trans-capacitance amplifier using an operational amplifier. The operational amplifier feedback path comprises a capacitor. The sensing device provides a very low voltage, so it is critical that the current leakage due to the operational amplifier input biasing circuitry is minimized. Therefore, the biasing circuitry circuitry requires a very low input current (<10 pA).

A conventional technique uses a MOS transistor connected between the output and the input of the operational amplifier, and biased at a very low DC current. One drawback of this technique is that the current through the MOS transistor is modulated by the voltage swing at the output of the operational amplifier. Another drawback is that large operational amplifier voltage swings drive the MOS transistor in a non-linear regime, therefore limiting the linear regime of the entire trans-capacitance amplifier. A refinement of this conventional technique uses a resistive divider at the output, with the MOS transistor connected between the divided voltage and the input of the operational amplifier. The effect of the modulation of the MOS transistor by the output voltage is reduced, however the noise of the amplifier is increased, the equivalent output-referred voltage offset is increased, and the operational amplifier must source the DC current flowing through the resistive divider.

Another conventional technique uses a trans-conductance amplifier comprising a differential, common-source MOS pair having an active load, the said MOS pair being biased in the sub-threshold region; wherein the said trans-conductance amplifier has its output connected to its inverting input, and the said trans-conductance amplifier has its non-inverting input connected to the said operational amplifier output. This technique also has the drawback of the modulation of its output current by the operational amplifier output signal and the drawback of a limited output voltage swing. A refinement of this conventional technique degenerates the said MOS pair by adding diodes in series with their sources, hence reducing the trans-conductance of the said differential pair and further reducing the said modulation of its output current. However, even using this technique, an input current in the range of hundreds of picoAmperes together with a large linear range of the operational amplifier output voltage cannot be obtained (the said linear range is limited at most to a couple hundreds mV).

SUMMARY

Aspects of the invention include a trans-capacitance amplifier comprising one input, one output, an operational amplifier, a feedback capacitor, circuitry to DC bias and to ensure a low impedance in AC the non-inverting input of the said operational amplifier, and multiple identical trans-conductance amplifiers, each comprising two differential, common-source MOS pairs, each said pair being either non-degenerated or degenerated by one or more MOS diodes connected in series, the said trans-conductance amplifiers being connected in a cascade configuration, the second transistor of each said pair is connected together with the first transistor of the next said pair and connected together to a current source, and the first transistor of the first said pair and the second transistor of the last said pair have an active load; wherein the said trans-conductance amplifier has its output connected to its non-inverting input, and the said trans-conductance amplifier has its non-inverting input to the said operational amplifier output.

Aspects of the invention include a differential trans-capacitance amplifier comprising one differential input, one differential output, a differential operational amplifier with a terminal for the control of the common-mode of the output voltage, two feedback capacitors, circuitry to DC bias the inputs of the said operational amplifier, and two differential trans-conductance amplifiers, each comprising two differential, common-source MOS pairs, each said pair being either non-degenerated or degenerated by one or more MOS diodes connected in series, the said trans-conductance amplifiers being connected in a cascade configuration, the second transistor of each said pair is connected together with the first transistor of the next said pair and connected together to a current source, and the first transistor of the first said pair and the second transistor of the last said pair have an active load; wherein the drains of the first transistors of the two trans-conductance amplifiers are connected together and further connected to the operational amplifier control terminal, the gates of the first transistors of the two trans-conductance amplifiers are connected together and further connected to a reference voltage, and the gates of the last transistors of each of the two trans-conductance amplifiers are connected to the outputs of the operational amplifier.

BRIEF DESCRIPTION OF THE DRAWINGS

The foregoing aspects and advantages of the present invention will become better understood upon reading the following detailed description and upon reference to the drawings where.

DETAILED DESCRIPTION OF PREFERRED EMBODIMENTS

The following description illustrates the present invention by way of example and not necessarily by way of limitation. Any reference to an element is understood to refer to at least one element. A set of elements is understood to include one or more elements. Any recited connection is understood to encompass a direct operative connection or an indirect operative connection through intermediary structure(s).

Figure 1:
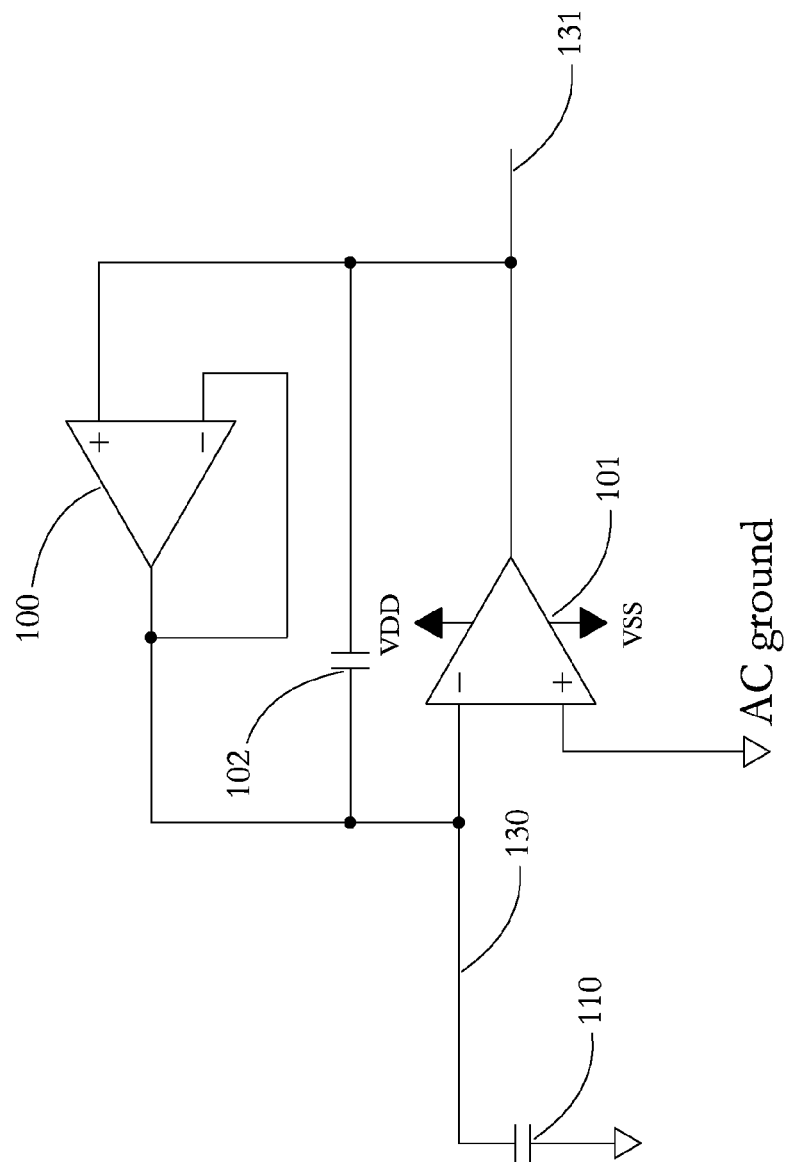
FIG. 1 shows the schematic of a single-ended, trans-capacitance amplifier which comprises a second amplifier used in a feedback configuration to bias the input of the said voltage amplifier, according to some embodiments of the present invention.

FIG. 1 shows the schematic of a trans-capacitance amplifier which amplifies the signal across a sensing device 110 modeled as a capacitor, according to some embodiments of the present invention. The AC input current flows from the sensing device 110 into the input 130, which is connected to the inverting input of the operational amplifier 101. The said input current is amplified into a voltage at the output 131. The trans-impedance function is realized by the feedback capacitor 102. The inverting input of 101 is DC biased by the trans-conductance amplifier 100, wherein the output of 100 is connected to the non-inverting input of 101. If the equivalent conductance of 100 is $g_{m100}$, and the swing of the node 131 is in the range of 1V, then the input current of the bias of the said trans-impedance amplifier is approximately $1V*g_{m100}$.

Figure 2:
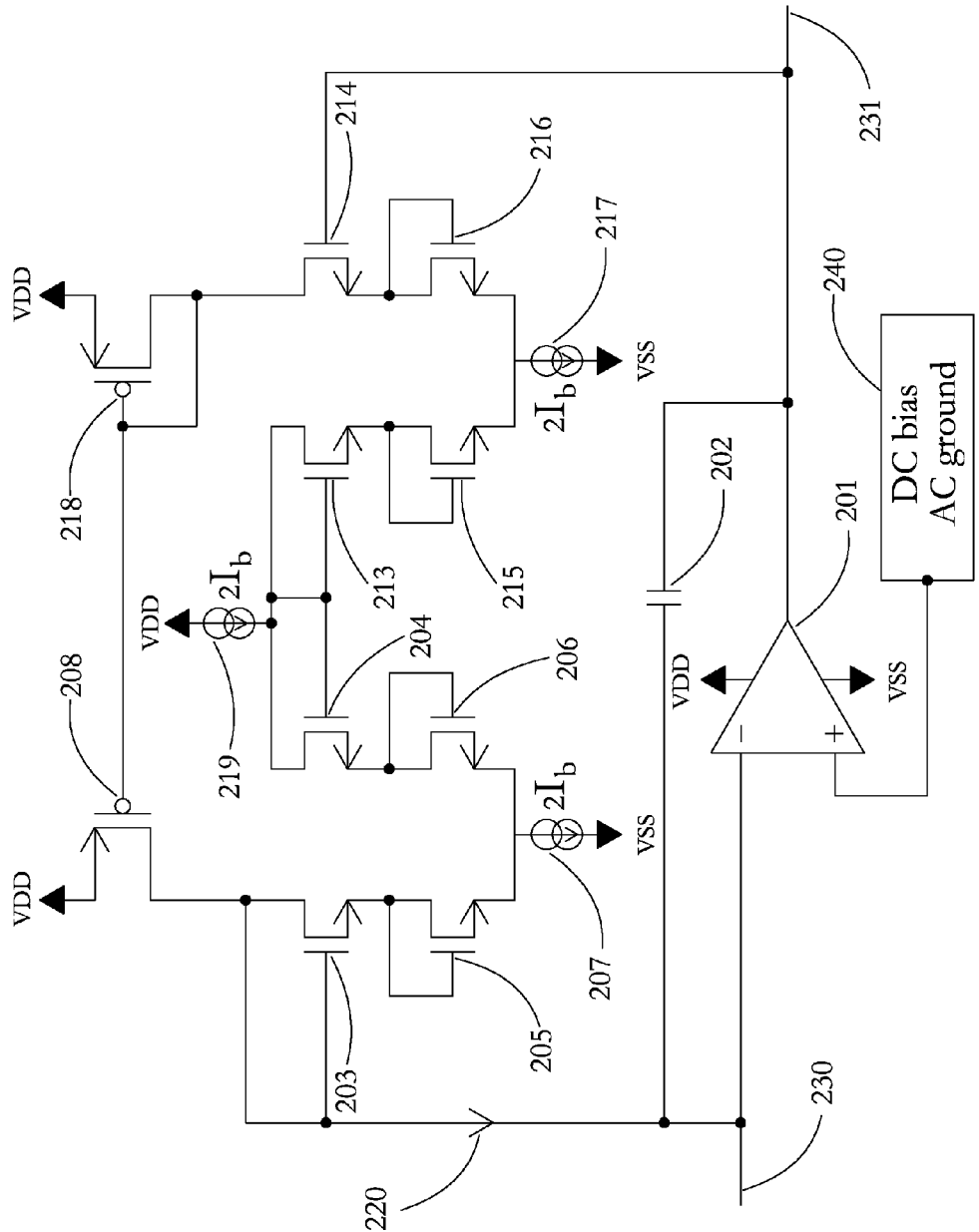
FIG. 2 shows the schematic of a single-ended, trans-capacitance amplifier which comprises a second amplifier used in a feedback configuration to bias the input of the said voltage amplifier, wherein the second amplifier uses two differential pairs using NMOS common-source transistors, according to some embodiments of the present invention.

FIG. 2 shows the schematic of a trans-capacitance amplifier, according to some embodiments of the present invention. The AC input current flows into the input 230, which is connected to the inverting input of the operational amplifier 201. The said input current is amplified into a voltage at the output 231. The trans-impedance function is realized by the feedback capacitor 202. A first differential NMOS pair comprises degenerated transistors 213 and 214. A second differential NMOS pair comprises degenerated transistors 203 and 204. Transistors 204 and 213 are connected as diodes, and are further connected to the current source 219. Transistors 203 and 214 have the transistors 208 and 218 connected as an active load. The transistor 203 is connected as a diode. Transistors 203, 204, 213, and 214 have the same geometry. Transistors 205, 206, 215, and 216 have the same geometry. The current sources 207, 217, and 219 bias the said differential pairs and the said active load in the sub-threshold region. If the output conductance of the active load is neglected, then the conductance $g_{TA}$ of the trans-conductance amplifier is:

$$g_{TA} = \frac{I_{220}}{V_{231}} = \frac{1}{2} * \frac{g_{m203}}{2}.$$

The said conductance $g_{TA}$ can be minimized by minimizing $g_{m203}$. The trans-conductance amplifier stays linear for a swing of the output voltage 231 as high as twice the linear swing of a single differential pair. All the MOS transistors shown in FIG. 2 can be standard MOS transistors available in a CMOS process, or can be of any special type: triple-well, native, low-threshold, high-threshold, etc.

Figure 3:
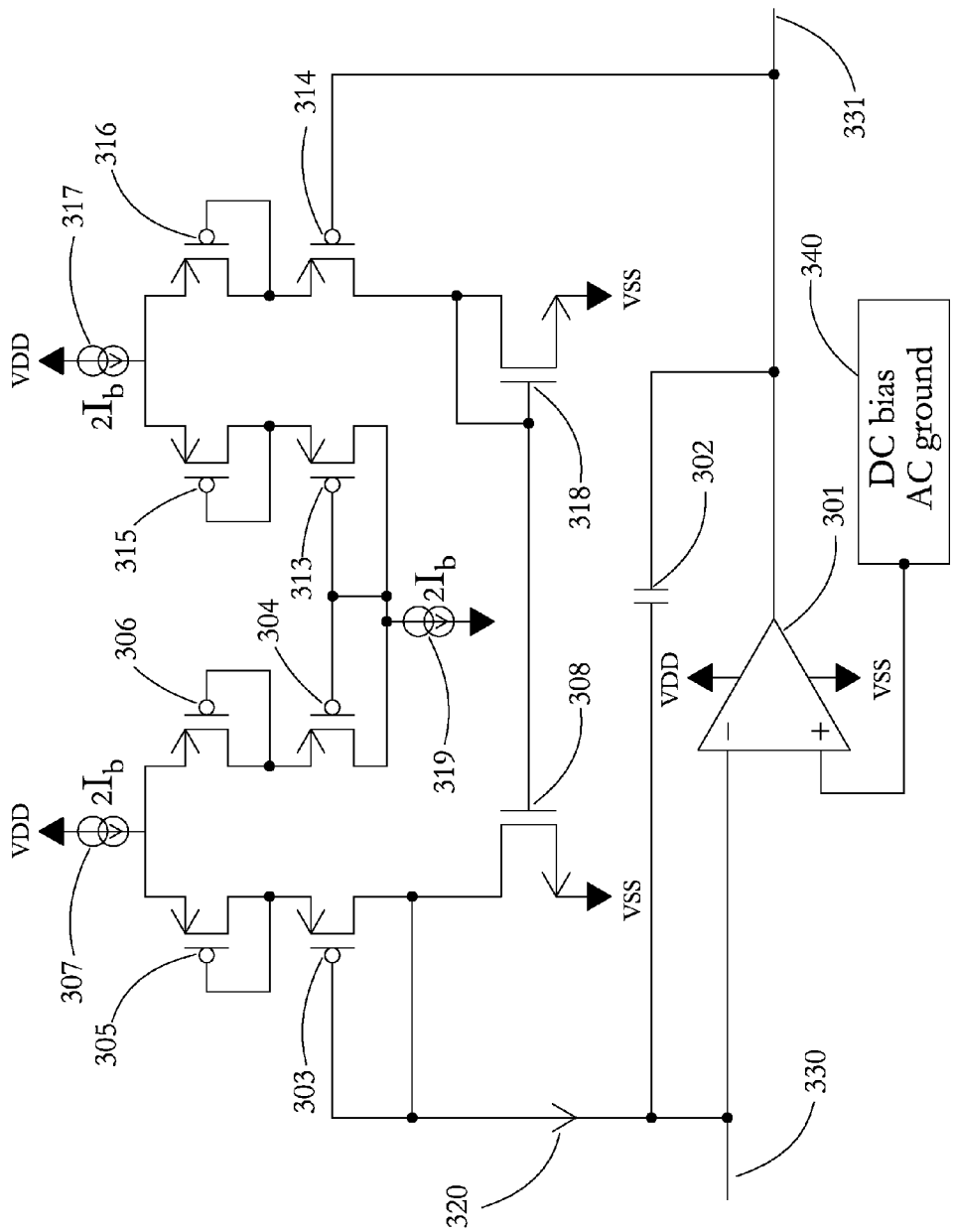
FIG. 3 shows the schematic of a single-ended, trans-capacitance amplifier which comprises a second amplifier used in a feedback configuration to bias the input of the said voltage amplifier, wherein the second amplifier uses two differential pairs using PMOS common-source transistors, according to some embodiments of the present invention.

FIG. 3 shows the schematic of a trans-capacitance amplifier, according to some embodiments of the present invention. The AC input current flows into the input 330, which is connected to the inverting input of the operational amplifier 301. The said input current is amplified into a voltage at the output 331. The trans-impedance function is realized by the feedback capacitor 302. A first differential PMOS pair comprises degenerated transistors 313 and 314. A second differential PMOS pair comprises degenerated transistors 303 and 304. Transistors 304 and 313 are connected as diodes, and are further connected to the current source 319. Transistors 303 and 314 have the transistors 308 and 318 connected as an active load. The transistor 303 is connected as a diode. Transistors 303, 304, 313, and 314 have the same geometry. Transistors 305, 306, 315, and 316 have the same geometry. The current sources 307, 317, and 319 bias the said differential pairs and the said active load in the sub-threshold region. If the output conductance of the active load is neglected, then the conductance $g_{TA}$ of the trans-conductance amplifier is:

$$g_{TA} = \frac{I_{320}}{V_{331}} = \frac{1}{2} * \frac{g_{m303}}{2}.$$

The said conductance $g_{TA}$ can be minimized by minimizing $g_{m303}$. The trans-conductance amplifier stays linear for a swing of the output voltage 331 as high as twice the linear swing of a single differential pair. All the MOS transistors shown in FIG. 3 can be standard MOS transistors available in a CMOS process, or can be of any special type: triple-well, native, low-threshold, high-threshold, etc.

Figure 4:
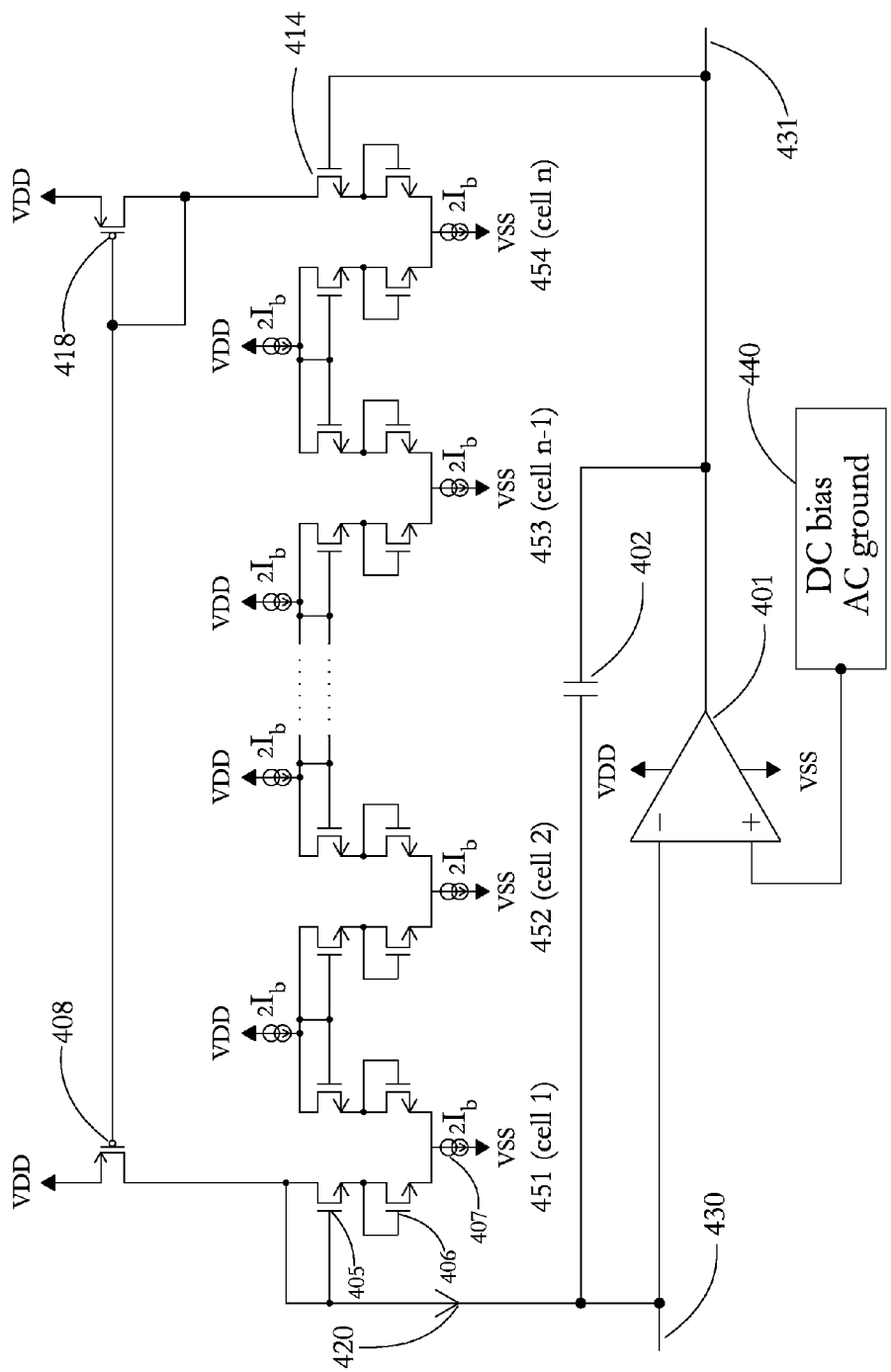
FIG. 4 shows the schematic of a single-ended, trans-capacitance amplifier which comprises a second amplifier used in a feedback configuration to bias the input of the said voltage amplifier, wherein the second amplifier uses a cascade of n cells, each said cell comprising two differential pairs using NMOS common-source transistors, according to some embodiments of the present invention.

FIG. 4 shows the schematic of a trans-capacitance amplifier, according to some embodiments of the present invention. The AC input current flows into the input 430, which is connected to the inverting input of the operational amplifier 401. The said input current is amplified into a voltage at the output 431. The trans-impedance function is realized by the feedback capacitor 402. The bias of the inverting input of 401 comprises a trans-conductance amplifier comprising a cascade of n cells, each said cell comprising a differential, degenerated NMOS pair. The second transistor of each said pair and the first transistor of the next said pair are each connected as diodes, and connected together to a current source. The current sources bias the said differential pairs in the sub-threshold region. The first transistor of the first said pair 405 and the second transistor of the last said pair 414 have the transistors 408 and 418 connected as an active load. The output of 401 is connected to the gate of 414. The transistor 405 is connected as a diode, with its drain and gate connected to 430. If the output conductance of the active load is neglected, then the conductance g, of the trans-conductance amplifier having as input the voltage of the node 431 and as output the current through the branch 420 is:

$$g_{TA} = \frac{I_{420}}{V_{431}} = \frac{1}{n} * \frac{g_{m405}}{2}.$$

The said conductance $g_{TA}$ can be minimized by minimizing $g_{m405}$, and by increasing the number of cells n. The trans-conductance amplifier stays linear for a swing of the output voltage 431 as high as 2*n the linear swing of a single differential pair, allowing a large range of output voltage swings of the trans-capacitance amplifier. All the MOS transistors shown in FIG. 4 can be standard MOS transistors available in a CMOS process, or can be of any special type: triple-well, native, low-threshold, high-threshold, etc.

In another embodiments of the present invention, the schematics shown in FIG. 4 can be modified to obtain a comparator, instead of a trans-capacitance amplifier. This can be obtained by eliminating the feedback capacitor 402.

In another embodiments of the present invention, the schematics shown in FIG. 4 can be duplicated in order to obtain a differential trans-capacitance amplifier, instead of a single-ended trans-capacitance amplifier.

Figure 5:
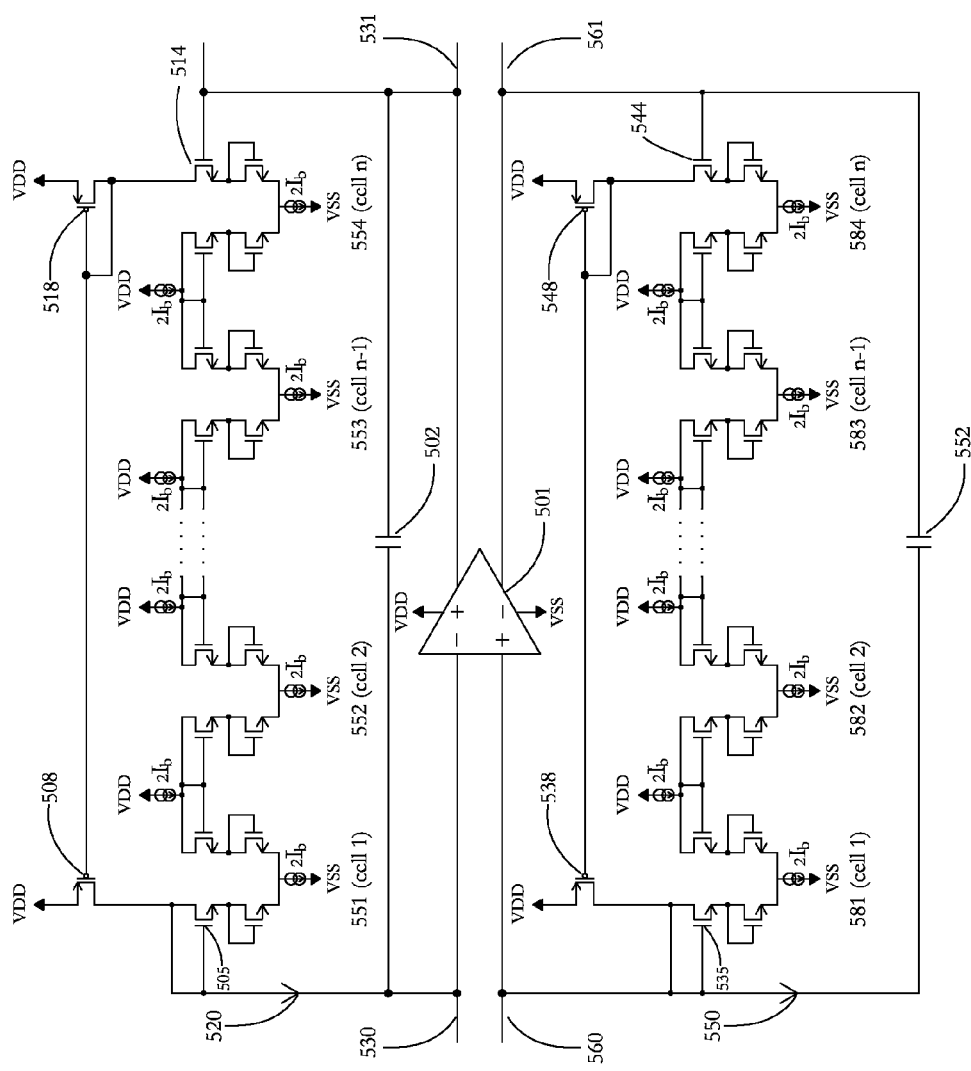
FIG. 5 shows the schematic of a differential, trans-capacitance amplifier which comprises a second amplifier used in a feedback configuration to bias each input of the said voltage amplifier, wherein the second amplifier uses a cascade of n cells, each said cell comprising two differential pairs using NMOS common-source transistors, according to some embodiments of the present invention.

FIG. 5 shows the schematic of a differential trans-capacitance amplifier, according to some embodiments of the present invention. Each of the two input differential currents flowing into the inputs 530 and 560 is amplified into a voltage at the differential outputs 531 and 561 using the differential operational amplifier 501, and the feedback capacitors 502 and 552. Each of the differential inputs of 501 is biased by a trans-conductance amplifier comprising a cascade of n cells, each said cell comprising a differential, degenerated NMOS pair, as disclosed in FIG. 4. The amplifier 501 comprises internal circuitry which sets the common-mode voltage of the differential outputs to a value allowing the normal operation of 501. The trans-conductance amplifier which biases the inverting input of the differential amplifier has its input connected to the non-inverting output of the differential amplifier. The trans-conductance amplifier which biases the non-inverting input of the differential amplifier has its input connected to the inverting output of the differential amplifier.

Figure 6:
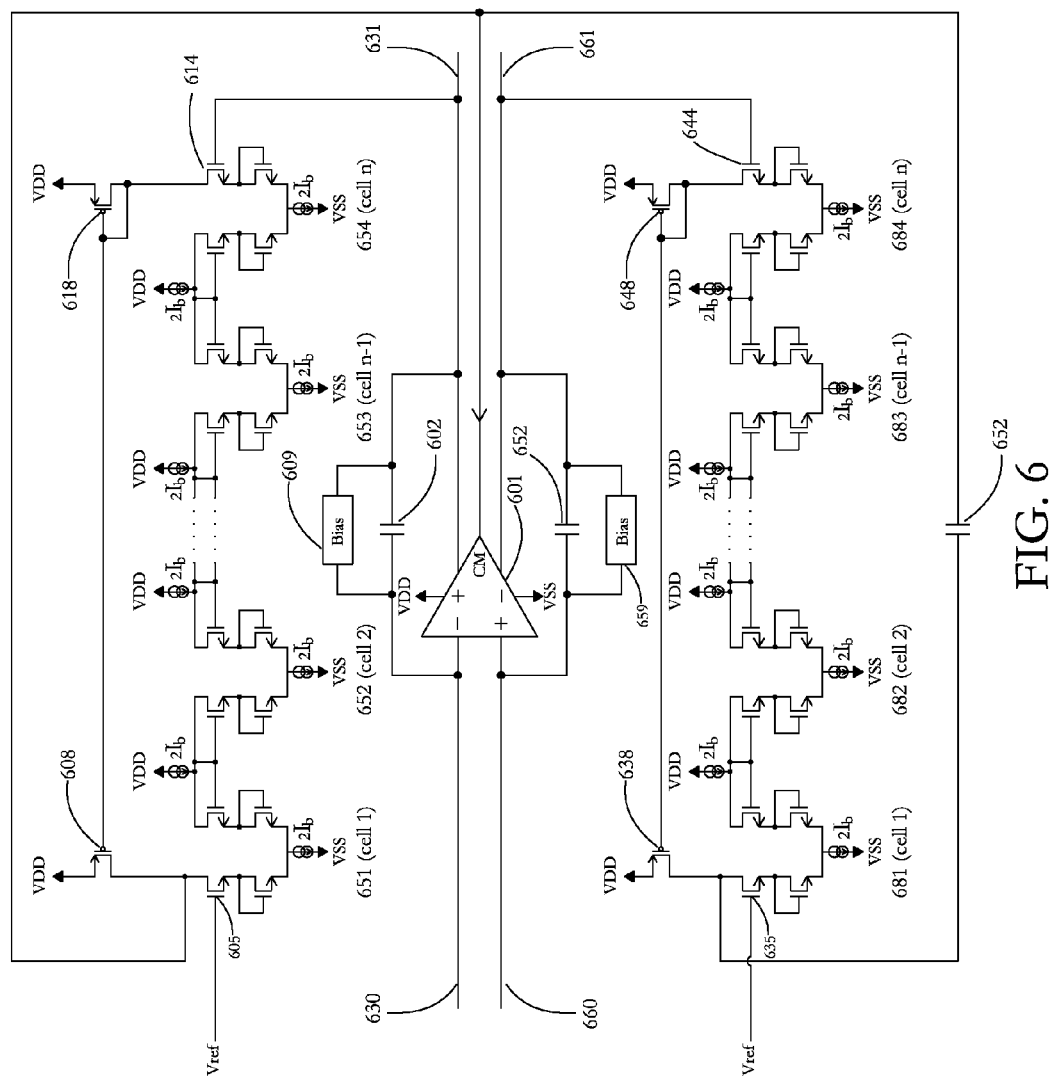
FIG. 6 shows the schematic of a differential, trans-capacitance amplifier which comprises a second amplifier used to control the common-mode control input terminal of the trans-capacitance amplifier, wherein the second amplifier uses a cascade of n cells, each said cell comprising two differential pairs using NMOS common-source transistors, according to some embodiments of the present invention.

FIG. 6 shows the schematic of a differential trans-capacitance amplifier, according to some embodiments of the present invention. Each of the two input differential currents flowing into the inputs 630 and 660 is amplified into a voltage at the differential outputs 631 and 661 using the differential operational amplifier 601, and the feedback capacitors 602 and 652. The amplifier 601 contains a control terminal CM which, if connected to a signal which phase substantially reproduce the phase of the common-mode voltage of the outputs of 601, sets the common-mode voltage of the differential outputs to a value allowing the normal operation of 601. The differential inputs of 601 are biased by the blocks 609 and 659. The differential outputs of 601 are each connected to the non-inverting inputs of two identical trans-conductance amplifiers, each comprising a cascade of n cells, each said cell comprising a differential, degenerated NMOS pair, as disclosed in FIG. 4. The inverting inputs of the said trans-conductance amplifiers are connected together and further connected to a reference voltage. The outputs of the said trans-conductance amplifiers are connected together and further connected to the terminal CM of 601. Because the input of each of the said trans-conductance amplifiers is connected to the gate of a MOS transistor, the differential amplifier 601 outputs do not sink or source any current into the circuitry used to set the common-mode voltage of the outputs of 601. Another advantage of this embodiment is that it allows the correct setting of the common-mode voltage of the outputs of 601 for an operation of the trans-capacitance amplifier with large output voltage swings.

It will be clear to one skilled in the art that the above embodiments will be altered depending upon the voltage supply. Taking as an example FIG. 4, a very low power supply circuit will require no degeneration of the said pairs, while a high power supply circuit will allow to use more than one diode as the degeneration of the said pairs, further reducing the trans-conductance of the biasing circuitry.

It will be clear to one skilled in the art that the above embodiments may be altered in many ways without departing from the scope of the invention. Accordingly, the scope of the invention should be determined by the following claims and their legal equivalents.

What is claimed is:

1. A single-ended trans-capacitance amplifier comprising:
   one input;
   one output;
   one operational amplifier having its inverting input connected to the said trans-capacitance amplifier input and its output connected to the said trans-capacitance amplifier output;
   one feedback capacitor having one plate connected to the said operational amplifier inverting input and the other plate to the said operational amplifier output;
   circuitry which biases DC the said operational amplifier non-inverting input and provides a very low AC impedance between the said non-inverting input and ground; and
   a cascade of at least two identical cells, each said cell comprising a differential MOS pair, the second transistor of each said pair and the first transistor of the next said pair being each connected as diodes, and connected together to a current source, the first transistor of the first said pair and the second transistor of the last said pair having transistors of the complementary type connected as an active load, the current sources biasing the said differential pairs and the said active load in the sub-threshold region, the drain and the gate of the first transistor of the first pair being connected to the said trans-capacitance amplifier input, the gate of the second transistor of the last said pair being connected to the said trans-capacitance amplifier output.

2. The trans-capacitance amplifier from claim 1, wherein the sources of the two transistors from each of the said differential MOS pairs are connected together.

3. The trans-capacitance amplifier from claim 1, wherein the sources of each of the two transistors from each of the said differential MOS pairs is connected to a series network comprising at least one transistor, which drain and gate are connected together, the drain and the gate of the first transistor from the network being connected to the source of the said MOS transistor from the differential pair, and the sources of the last transistors from the network are connected together.

4. A differential trans-capacitance amplifier comprising:
   one differential operational amplifier, comprising one differential input, one differential output, and circuitry to set to a proper value the common-mode voltage of the said operational amplifier output;
   one differential input connected to the differential operational amplifier input;
   one differential output connected to the differential operational amplifier output; and
   two identical trans-conductance paths, the first path connecting the said positive differential input to the said negative differential output, and the second path connecting the said negative differential input to the said positive differential output, each said trans-conductance path comprising a cascade of at least two identical cells, each said cell comprising a differential MOS pair, the second transistor of each said pair and the first transistor of the next said pair being each connected as diodes, and connected together to a current source, the first transistor of the first said pair and the second transistor of the last said pair having transistors of the complementary type connected as an active load, the current sources biasing the said differential pairs and the said active load in the sub-threshold region, the drain and the gate of the first transistor of the first pair being connected to one of the said differential inputs having a certain polarity, the gate of the second transistor of the last said pair being connected to the said differential output having an opposite polarity.

5. The trans-capacitance amplifier from claim 4, wherein the sources of the two transistors from each of the said differential MOS pairs are connected together.

6. The trans-capacitance amplifier from claim 4, wherein the sources of each of the two transistors from each of the said differential MOS pairs is connected to a series network comprising at least one transistor, which drain and gate are connected together, the drain and the gate of the first transistor from the network being connected to the source of the said MOS transistor from the differential pair, and the sources of the last transistors from the network are connected together.

7. A differential trans-capacitance amplifier comprising:
   one differential operational amplifier, comprising one differential input, one differential output, one control terminal, and circuitry to set to a proper value the common-mode voltage of the said operational amplifier output when the control terminal is connected to a signal substantially in phase with the common-mode voltage of the said operational amplifier;
   one differential input connected to the differential operational amplifier input;
   one differential output connected to the differential operational amplifier output;
   two identical trans-conductance paths, each path having differential inputs;
   wherein each trans-conductance path comprises a differential MOS pair, the second transistor of each said pair and the first transistor of the next said pair being each connected as diodes, and connected together to a current source, the first transistor of the first said pair and the second transistor of the last said pair having transistors of the complementary type connected as an active load, the current sources biasing the said differential pairs and the said active load in the sub-threshold region, the gate of the first transistor of the first pair of one path being connected to the gate of the first transistor of the first pair of the other path and further connected to a reference voltage, the gate of the second transistor of the last pair of each path being connected to one of the said differential outputs, and the drain of the first transistor of the first pair of one path being connected to the drain of the first transistor of the first pair of the other path and further connected to the said control terminal.

8. The trans-capacitance amplifier from claim 7, wherein the sources of the two transistors from each of the said differential MOS pairs are connected together.

9. The trans-capacitance amplifier from claim 7, wherein the sources of each of the two transistors from each of the said differential MOS pairs is connected to a series network comprising at least one transistor, which drain and gate are connected together, the drain and the gate of the first transistor from the network being connected to the source of the said MOS transistor from the differential pair, and the sources of the last transistors from the network are connected together.

10. An integrated circuit processing the voltage across a sensing device, the said integrated circuit comprising:
    one terminal;
    one operational amplifier having its inverting input connected to the said integrated circuit terminal;
    circuitry which biases DC the said operational amplifier non-inverting input and provides a very low AC impedance between the said non-inverting input and ground; and
    a cascade of at least two identical cells, each said cell comprising a differential MOS pair, the second transistor of each said pair and the first transistor of the next said pair being each connected as diodes, and connected together to a current source, the first transistor of the first said pair and the second transistor of the last said pair having transistors of the complementary type connected as an active load, the current sources biasing the said differential pairs and the said active load in the sub-threshold region, the drain and the gate of the first transistor of the first pair being connected to the said operational amplifier inverting input, the gate of the second transistor of the last said pair being connected to the said operational amplifier output.

\* \* \* \* \*